United States Patent
Agarwal et al.

(10) Patent No.: US 8,151,240 B2
(45) Date of Patent: Apr. 3, 2012

(54) EFFECTIVE GATE LENGTH CIRCUIT MODELING BASED ON CONCURRENT LENGTH AND MOBILITY ANALYSIS

(75) Inventors: Kanak B. Agarwal, Austin, TX (US); Vivek Joshi, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 390 days.

(21) Appl. No.: 12/416,222

(22) Filed: Apr. 1, 2009

(65) Prior Publication Data

US 2010/0257493 A1 Oct. 7, 2010

(51) Int. Cl.
G06F 9/455 (2006.01)
G06F 17/50 (2006.01)
G06F 11/22 (2006.01)

(52) U.S. Cl. ........................... 716/136; 716/132
(58) Field of Classification Search .................. 716/132, 716/136
See application file for complete search history.

(56) References Cited

U.S. PATENT DOCUMENTS

| | | | |
|---|---|---|---|
| 6,562,638 | B1 | 5/2003 | Balasinski et al. |
| 7,673,260 | B2 * | 3/2010 | Chen et al. ........ 716/106 |
| 2003/0066034 | A1 * | 4/2003 | Gross et al. ........ 716/1 |
| 2007/0094623 | A1 * | 4/2007 | Chen et al. ........ 716/4 |

OTHER PUBLICATIONS

Author: Artur Balasinski; Title: A Methodology to Analyze Circuit Impact of Process-Related MOSFET Geometry; Item: article; Date: 2004; Pages: pp. 85-92; Issue: vol. 5379, No. 1; Publisher: SPIE.
Author: Poppe et al.; Title: From Poly Line to Transistor: Building BSIM Models for Non-Rectangular Transistors; Item: article; Date: 2006; pp. 9; Issue: Proc. of SPIE, vol. 6156; Publisher: SPIE.
Author: Gupta et al.; Title: Modeling of Non-Uniform Device Geometries for Postlithography Circuit Analysis Item: article; Date: 2006; pp. 10; Issue: Proc. of SPIE, vol. 6156; Publisher: SPIE.

(Continued)

*Primary Examiner* — Suresh Memula
(74) *Attorney, Agent, or Firm* — Garg Law Firm, PLLC; Rakesh Garg; Libby Z. Toub

(57) ABSTRACT

Disclosed is a computer implemented method and computer program product to determine metal oxide semiconductor (MOS) gate functional limitations. A simulator obtains a plurality of slices of a MOS gate, the slices each comprising at least one parameter, the parameter comprising a slice gate width and a slice gate length. The simulator determines a current for each slice based on a slice gate length of the slice to form a length-based current for each slice. The simulator determines a length-based current for the MOS gate by summing the length-based current for each slice. The simulator calculates a stress profile for each slice. The simulator determines a slice carrier mobility for each slice based on the stress profile of each slice. The simulator determines a carrier mobility-based current for each slice, based on each slice carrier mobility. The simulator determines a carrier mobility for the MOS gate based on the carrier mobility-based current for each slice. The simulator determines an effective length for the MOS gate based on the length-based current.

14 Claims, 4 Drawing Sheets

OTHER PUBLICATIONS

Author: Singhal et al.; Title: Modeling and Analysis of Non-Rectangular Gate for Post-Lithography Circuit Simulation; Item: article; Date: 2007; Pages: pp. 823-828; Issue: Proc. of DAC; Publisher: DAC.

Author: Trouiller et al.; Title: 65-nm gate OPC Optimization with Simple Electrical Model Simulation; Item: article; Date: 2005; Pages: pp. 378-388: Issue: Proc of SPIE, vol. 5756, No. 38; Publisher: SPIE.

Author: Joshi et al.: Title: Stess Aware Layout Optimization; Item: article; Date: 2008; Pages: pp. 168-174; Issue: 978-1-60558-048: Publisher: ISPD '08.

* cited by examiner

EFFECTIVE GATE LENGTH CIRCUIT MODELING BASED ON CONCURRENT LENGTH AND MOBILITY ANALYSIS

BACKGROUND OF THE INVENTION

1. Field of the Invention

The present invention relates generally to a computer implemented method, and computer program product for detecting faults or out-of-tolerance performance in circuits at nanometer scales. More specifically, the present invention relates to determining leakage current, drive current, and thus effective gate length and carrier mobility for a design of a physical circuit.

2. Description of the Related Art

Moore's law is a paradigm of competitiveness that states that semiconductor manufacturers must attain circuit density improvements on an order of 100% improvement over 12 to 18 month timescales. Such design goals result in circuit designers building integrated circuits with smaller tolerances with each stage of technology evolution. For example, current design technologies that apply 65 nm complementary metal oxide semiconductors (CMOS) now must account for mechanical stress as a factor that affects the quantum movements of electrons in a circuit. Stress inducing materials such as SiGe, nitride liners, and shallow trench isolation (STI) can vary stress across the width of transistor geometry. In particular, the generally rectangular cross-section of a gate and channel can have a stress profile that varies as a function of displacement from a gate input or other threshold, but not necessarily only because of the displacement from gate input.

As a result, compressive or tensile forces at each slice of a gate can either contribute to, or diminish electron or hole mobility through the gate. These changes, if not accounted for can cause the threshold voltage, $V_{th}$, carrier mobility or both to change beyond design tolerances. Accordingly, previous generations of circuit designers have proceeded with a design by assuming the electron mobility remained constant through each profile of a MOS gate. A metal oxide semiconductor (MOS) gate is a voltage-controlled switch that conducts when a gate-to-source voltage is above a threshold voltage. The MOS gate is constructed from silicon doped with a dopant to form a source and a drain. The MOS gate includes a gate that is disposed in a manner to form a channel of conducting substrate that links the drain and the source with flowing electrons during a range of operations. Source and drain may be either P-type or N-type material.

These stresses, in addition to other MOS or layout parameters, can affect leakage current ($I_{off}$) and drive current ($I_{on}$). Leakage current is current that flows across a dielectric area between two nearby conductors while a gate is off. Drive current is the current that flows to a drain of a gate or transistor when the gate is turned on. As can be appreciated, reducing geometries of layers such as silicon dioxide can increase leakage current due to dielectric effects. Consequently, absent due care to handle shrinking geometries, leakage current can grow to unmanageable levels causing excess standby power dissipation and reliability issues.

An accurate accounting of varying stresses along a gate's length can provide a more accurate determination whether the gate can function using the gate's current or proposed geometry coupled with other MOS or layout parameters.

SUMMARY OF THE INVENTION

The present invention provides a computer implemented method and computer program product to determine metal oxide semiconductor (MOS) gate functional limitations. A simulator obtains a plurality of slices of a MOS gate, the slices each comprising at least one parameter, the parameter comprising a slice gate width and a slice gate length. The simulator determines a current for each slice based on a slice gate length of the slice to form a length-based current for each slice. The simulator determines a length-based current for the MOS gate by summing the length-based current for each slice. The simulator calculates a stress profile for each slice. The simulator determines a slice carrier mobility for each slice based on the stress profile of each slice. The simulator determines a carrier mobility-based current for each slice based on each slice carrier mobility. The simulator determines a carrier mobility for the MOS gate based on the carrier mobility-based current for each slice. The simulator determines an effective length for the MOS gate based on the length-based current.

Additional illustrative embodiments may provide an alternative a computer implemented method and apparatus to determine metal oxide semiconductor (MOS) gate functional limitations. A simulator obtains a plurality of slices of a MOS gate, the slices each comprising at least one parameter, the parameter comprising a slice gate width, a slice gate length, and a slice stress profile. A simulator determines a drive current for each slice based on a slice gate length and a slice stress profile. A simulator sums the drive currents for each slice to form a gate drive current. A simulator determines a leakage current for each slice based on a slice gate length and a stress profile of the gate. A simulator sums the leakage currents for each slice to form a gate leakage current. A simulator can concurrently determines an effective length for the MOS gate based on the gate drive current and the gate leakage current with determining carrier mobility for the MOS gate based on the gate drive current and the gate leakage current.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of an illustrative embodiment when read in conjunction with the accompanying drawings, wherein:

DETAILED DESCRIPTION OF THE PREFERRED EMBODIMENT

Figure 1:
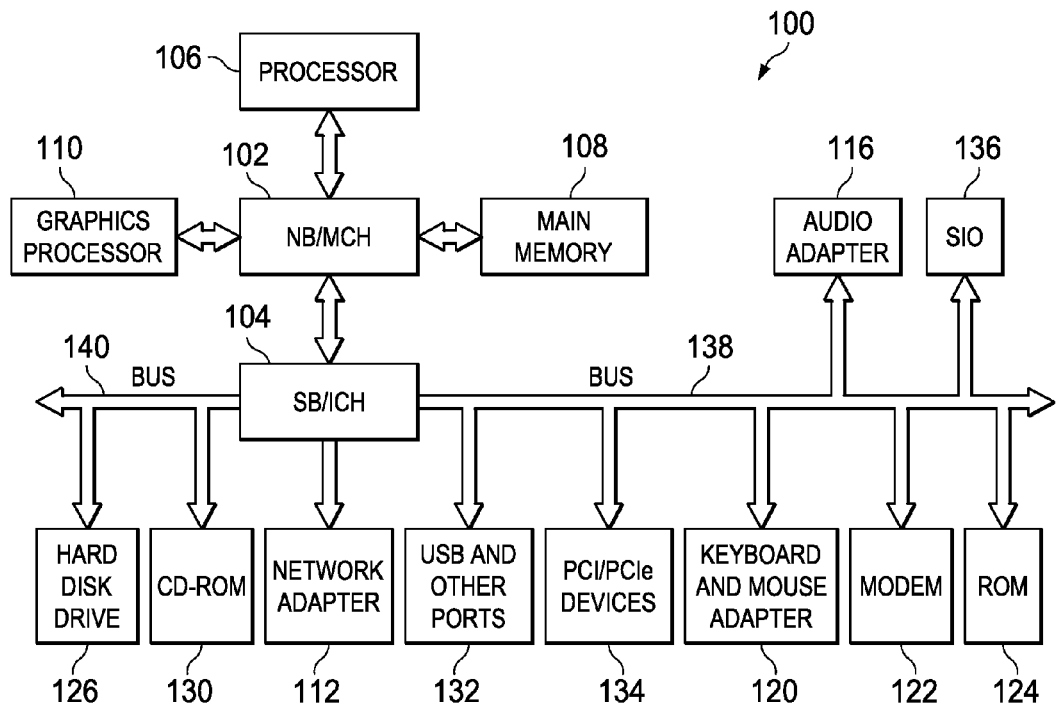
FIG. 1 is a data processing system in accordance with an illustrative embodiment of the invention.

With reference now to the figures and in particular with reference to FIG. 1, a block diagram of a data processing system is shown in which aspects of an illustrative embodiment may be implemented. Data processing system 100 is an example of a computer, in which code or instructions implementing the processes of the present invention may be located. In the depicted example, data processing system 100 employs a hub architecture including a north bridge and memory controller hub (NB/MCH) 102 and a south bridge and input/output (I/O) controller hub (SB/ICH) 104. Processor 106, main memory 108, and graphics processor 110 connect to north bridge and memory controller hub 102. Graphics processor 110 may connect to the NB/MCH through an accelerated graphics port (AGP), for example.

In the depicted example, local area network (LAN) adapter 112 connects to south bridge and I/O controller hub 104 and audio adapter 116, keyboard and mouse adapter 120, modem 122, read only memory (ROM) 124, hard disk drive (HDD) 126, CD-ROM drive 130, universal serial bus (USB) ports and other communications ports 132, and PCI/PCIe devices 134 connect to south bridge and I/O controller hub 104 through bus 138 and bus 140. PCI/PCIe devices may include, for example, Ethernet adapters, add-in cards, and PC cards for notebook computers. PCI uses a card bus controller, while PCIe does not. ROM 124 may be, for example, a flash binary input/output system (BIOS). Hard disk drive 126 and CD-ROM drive 130 may use, for example, an integrated drive electronics (IDE) or serial advanced technology attachment (SATA) interface. A super I/O (SIO) device 136 may be connected to south bridge and I/O controller hub 104.

An operating system runs on processor 106 and coordinates and provides control of various components within data processing system 100 in FIG. 1. The operating system may be a commercially available operating system such as Microsoft® Windows® XP. Microsoft and Windows are trademarks of Microsoft Corporation in the United States, other countries, or both. An object oriented programming system, such as the Java™ programming system, may run in conjunction with the operating system and provides calls to the operating system from Java™ programs or applications executing on data processing system 100. Java™ is a trademark of Sun Microsystems, Inc. in the United States, other countries, or both.

Instructions for the operating system, the object-oriented programming system, and applications or programs are located on storage devices, such as hard disk drive 126, and may be loaded into main memory 108 for execution by processor 106. The processes of the present invention can be performed by processor 106 using computer implemented instructions, which may be located in a memory such as, for example, main memory 108, read only memory 124, or in one or more peripheral devices.

Those of ordinary skill in the art will appreciate that the hardware in FIG. 1 may vary depending on the implementation. Other internal hardware or peripheral devices, such as flash memory, equivalent non-volatile memory, and the like, may be used in addition to or in place of the hardware depicted in FIG. 1. In addition, the processes of the illustrative embodiments may be applied to a multiprocessor data processing system.

In some illustrative examples, data processing system 100 may be a personal digital assistant (PDA), which is configured with flash memory to provide non-volatile memory for storing operating system files and/or user-generated data. A bus system may be comprised of one or more buses, such as a system bus, an I/O bus and a PCI bus. Of course, the bus system may be implemented using any type of communications fabric or architecture that provides for a transfer of data between different components or devices attached to the fabric or architecture. A communication unit may include one or more devices used to transmit and receive data, such as a modem or a network adapter. A memory may be, for example, main memory 108 or a cache such as found in north bridge and memory controller hub 102. A processing unit may include one or more processors or CPUs. The depicted example in FIG. 1 is not meant to imply architectural limitations. For example, data processing system 100 also may be a tablet computer, laptop computer, or telephone device in addition to taking the form of a PDA.

The terminology used herein is for the purpose of describing particular embodiments only and is not intended to be limiting of the invention. As used herein, the singular forms "a", "an", and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

As will be appreciated by one skilled in the art, the present invention may be embodied as a system, method or computer program product. Accordingly, the present invention may take the form of an entirely hardware embodiment, an entirely software embodiment (including firmware, resident software, micro-code, etc.) or an embodiment combining software and hardware aspects that may all generally be referred to herein as a "circuit," "module", or "system." Furthermore, the present invention may take the form of a computer program product embodied in any tangible medium of expression having computer usable program code embodied in the medium.

Any combination of one or more computer usable or computer readable medium(s) may be utilized. The computer-usable or computer-readable medium may be, for example but not limited to, an electronic, magnetic, optical, electromagnetic, infrared, or semiconductor system, apparatus, device, or propagation medium. More specific examples (a non-exhaustive list) of the computer-readable medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CDROM), an optical storage device, a transmission media such as those supporting the Internet or an intranet, or a magnetic storage device. Note that the computer-usable or computer-readable medium could even be paper or another suitable medium upon which the program is printed, as the program can be electronically captured, via, for instance, optical scanning of the paper or other medium, then compiled, interpreted, or otherwise processed in a suitable manner, if necessary, and then stored in a computer memory. In the context of this document, a computer-usable or computer-readable medium may be any medium that can contain, store, communicate, propagate, or transport the program for use by or in connection with the instruction execution system, apparatus, or device. The computer-usable medium may include a propagated data signal with the computer-usable program code embodied therewith, either in baseband or as part of a carrier wave. The computer usable program code may be transmitted using any appropriate medium, including but not limited to wireless, wireline, optical fiber cable, RF, etc.

Computer program code for carrying out operations of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

The present invention is described below with reference to flowchart illustrations and/or block diagrams of methods, apparatus and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer-readable medium that can direct a computer or other programmable data processing apparatus to function in a particular manner, such that the instructions stored in the computer-readable medium produce an article of manufacture including instruction means which implement the function/act specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide processes for implementing the functions/acts specified in the flowchart and/or block diagram block or blocks.

The aspects of the illustrative embodiments provide a computer implemented method, data processing system, and computer program product for determining effective length for a non-rectangular metal oxide semiconductor (MOS) gate by approximating the non-rectangular gate with a rectangular MOS gate. Effective length or effective gate length is the length of a rectangular gate that models a non-rectangular gate for purposes of simulating the non-rectangular gate's electrical characteristics using electrical simulators such as, for example, SPICE, HSPICE, power SPICE among others. The effective length, as determined by illustrative embodiments, can take into account carrier mobility variations caused by stress on the channel of a gate. Moreover, embodiments may concurrently apply varied stress profiles across a gate width to form an effective mobility of a non-rectangular, and stress-varied MOS gate to model a physical gate or a proposed gate design in a manner that the model of the physical or proposed gate design has insubstantial differences in performance with the actual physical or proposed gate. The illustrative embodiments use two values to match both drive and leakage current. Accordingly, embodiments take into account the non-uniform carrier mobility across the device width.

Figure 2A:
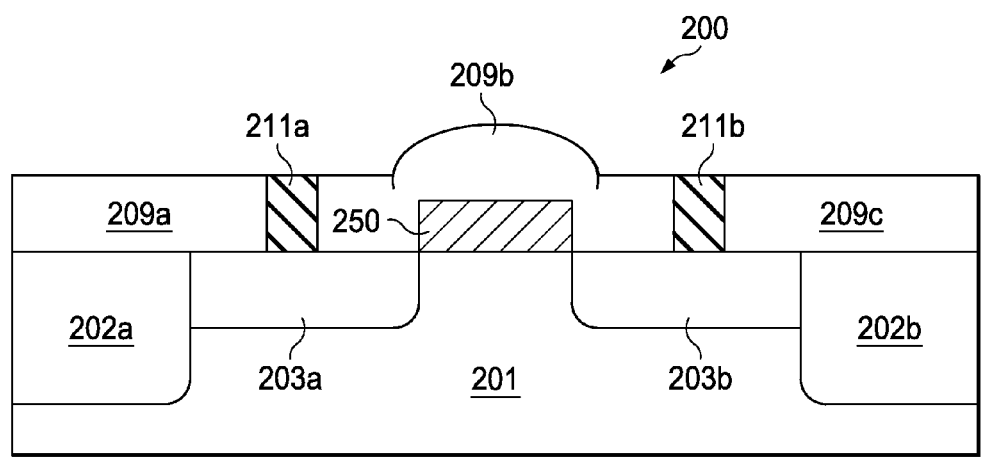
FIG. 2A is a cross-section of a metal oxide semiconductor (MOS) transistor or gate on a silicon substrate in accordance with an illustrative embodiment of the invention.

FIG. 2A is a cross-section of a metal oxide semiconductor (MOS) transistor or gate on a silicon substrate in accordance with an illustrative embodiment of the invention. MOS gate 200 has integrated circuit features that induce stress in gate 250 and the channel region below it. An integrated circuit feature is a volume of material that contrasts with a neighboring region to produce an effect in a circuit at or near the integrated circuit feature. Integrated circuit features that induce stress include, for example, a silicon nitride liner ($Si_3N_4$), an embedded SiGe source/drain, or shallow trench isolation, among others. A silicon nitride liner is a layer of silicon nitride deposited on the die and/or on layers supported by the die. A SiGe source is a source made of SiGe. A SiGe drain is a drain made of SiGe. Shallow trench isolation is an integrated circuit feature, composed of a dielectric material, e.g., usually silicon dioxide, which prevents electrical current leakage between adjacent semiconductor device components.

Gate 250 includes silicon nitride layer 209*a*, 209*b*, 209*c*, embedded SiGe source 203*a*, embedded SiGe drain 203*b*, as well as shallow trench isolation substrate 202*a* and shallow trench isolation substrate 202*b* supported by a silicon substrate 201. Metal contact 211*a* may supply current to source 203*a*. Similarly, metal contact 211*b* may attach to drain 203*b*. The application of a voltage above a threshold voltage at gate 250, induces a channel underlying gate 250 to become saturated, thereby turning on gate 250. The channel is present or not present in substrate 201 depending on the voltage applied at gate 250.

Figure 2B:
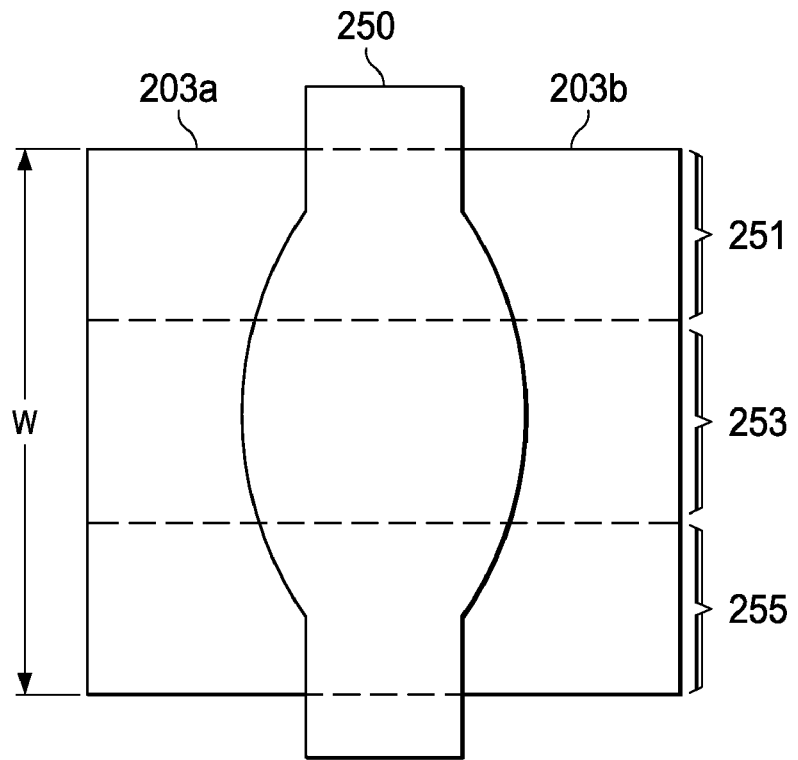
FIG. 2B is a top view of a layout generated by a lithography simulator of the transistor or gate in accordance with an illustrative embodiment of the invention.

FIG. 2B is a top view of a layout generated by a lithography simulator of the transistor or gate in accordance with an illustrative embodiment of the invention. For clarity, source 203*a*, gate 250, and drain 203*b* are illustrated. A width dimension (W) to gate 250 is shown as a distance that gate 250 extends, but no longer than the extent of the substantially adjacent features of source 203*a* and drain 203*b*. The channel within silicon 201, of FIG. 2A, through which electrons pass from source 203*a* to drain 203*b* pass between source 203*a* and drain 203*b* substantially within the width.

Gate 250 is broken down into slices in order to more completely model the operation of the gate. Each slice has planar boundaries that are parallel to the boundaries of other slices. Each slice includes two contours, namely a source-side contour and a drain-side contour. A contour is a line or boundary of a gate that is not tangential to the width or transverse dimension of the gate for the entire width of a slice. For example, a contour may be a curve. Curves in the gate contour are an unavoidable feature caused by light diffraction, among other causes. A MOS gate having irregular or curved contours is a non-rectangular gate. By breaking the gate into slices, each slice may be modeled as a rectangular gate to determine the functionality of the channel that underlies the slice, and in particular the length of the channel under the slice. Gate 250 is divided into three slices, namely, slice 251, slice 253, and slice 255. The combined effect of the slices is explained further with respect to FIGS. 4 and 5 below. Accordingly, the function of a non-rectangular gate may be more closely approximated or estimated. A non-rectangular gate is a gate that has irregular or non-linear contours. In contrast, a rectangular gate is a gate that has a source-side contour that is parallel to a drain-side contour and such contours are tangential to the length of the gate.

Figure 3:
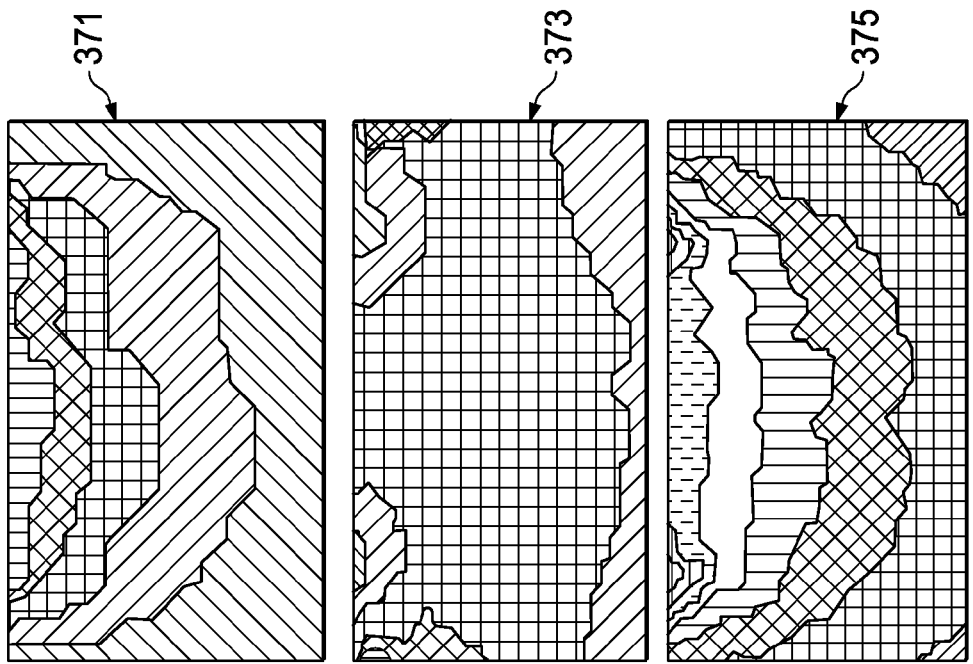
FIG. 3 is a rectangular model of a physical gate or transistor of FIGS. 2A and 2B in accordance with an illustrative embodiment of the invention.
Figure 3:
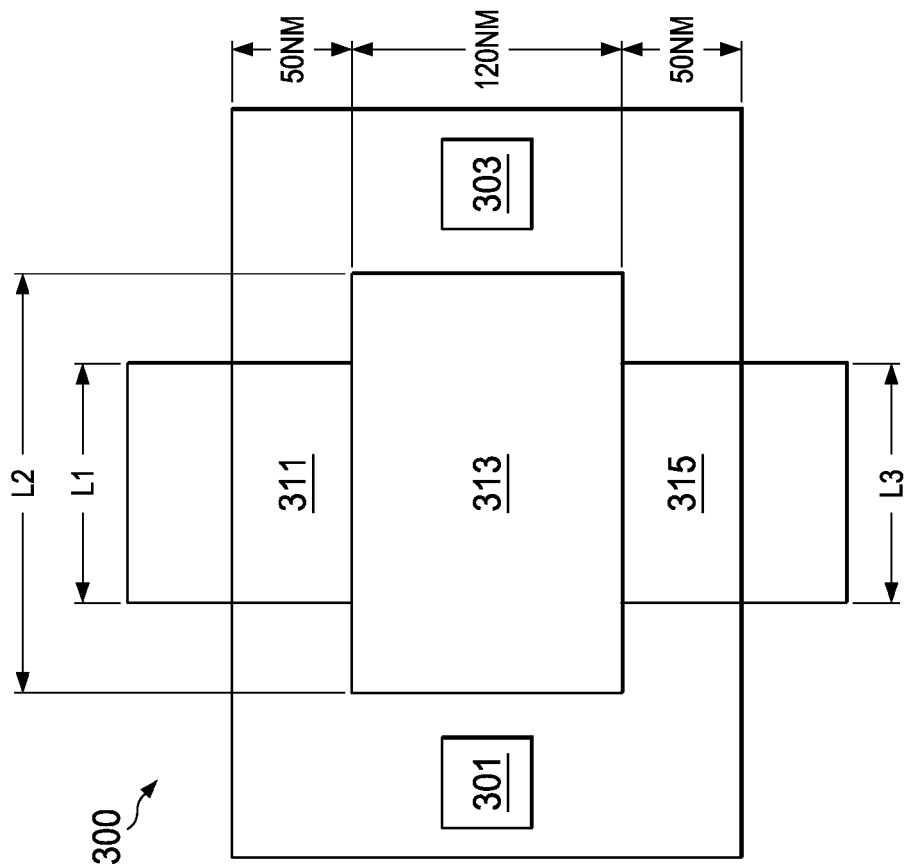

FIG. 3 is a rectangular model of a physical gate or transistor of FIGS. 2A and 2B in accordance with an illustrative embodiment of the invention. Slices expressed as rectangles in MOS gate 300 correspond to slices of the modeled gate in FIG. 2B. A slice is comprised of a slice gate width, a slice gate length, and a slice carrier mobility. The features of a slice correspond to, and model, a physical gate. The physical gate may be a gate under test or be a gate to be manufactured according to a circuit design, explained further below. Rectangular slice 311 corresponds to slice of the modeled gate 251 in FIG. 2B. Similarly, rectangular slice 313 corresponds to slice of the modeled gate 253. Rectangular slice 315 corresponds to slice of modeled gate 255, also in FIG. 2B. The collective slices can be modeled together along width 300 of the model transistor. A slice width is the width of the slice between the parallel planes that separate slices or bound the source and/or drain. A slice gate length is a representative measure of the corresponding physical gate. The slice gate length can be, for example, an average of a contour of the gate within the slice. Alternatively, the slice gate length can be, for example, an average of the distances between opposing contours of the slice.

FIG. 3 also depicts modeled effects of stress-inducing features at or near the source, gate, or drain. For example, metal contacts 301 and 303 can influence a longitudinal stress, for example, along length L2 of slice 313. Accordingly, stress profile 371, stress profile 373, and stress profile 375 correspond to slice 311, slice 313, and slice 315, respectively. A stress profile, such as stress profiles 371, 373, and 375, is a predicted stress calculated along a representative longitudinal plane in a channel below the gate, for example, below gate 250 of FIG. 2A. The predicted stress can be a contour plot measuring varying gradations of tension or compression in Pascals. Stress can be predicted or modeled using a 3 dimensional modeling data processing system using computer instructions of a modeling software. Stress profiles for a device can captured by simulating the device fabrication process in a process simulator such as Tsuprem4 manufactured by Synopsys, and the corresponding effect on mobility and device current can be analyzed by using a 3D device simulator such as Davinci 3D TCAD manufactured by Synopsys. These tools or modeling software, and other circuit modeling data processing systems can solve stress-based mobility equations to establish an effective mobility for each slice. Accordingly, the data processing systems executing such instructions can calculate or determine carrier mobility for at least each slice. As will be explained with reference to FIG. 4, below, illustrative embodiments of the invention further calculate a carrier mobility for the MOS gate based on the influences of the modeled slices. A carrier mobility for the MOS gate (or effective mobility) is the mobility of carriers in a channel of a rectangular transistor or gate that models the performance of the non-rectangular transistor having a width identical to the width of the rectangular transistor. By modeling, it is meant that the rectangular transistor that serves as a model has insubstantial differences in overall performance with respect to the actual performance of the modeled non-rectangular transistor for the purposes of designing and using an integrated circuit built using the modeled non-rectangular transistor. A carrier mobility describes the ease with which carriers drift in the substrate material, for example in the channel below the gate. The carrier mobility is defined by the ratio of average carrier drift velocity over an electric field. A typical unit of measure of carrier mobility is $cm^2/V$-sec. A slice carrier mobility is a carrier mobility modeled for the slice based on the slice gate length and a stress profile of the slice.

Figure 4:
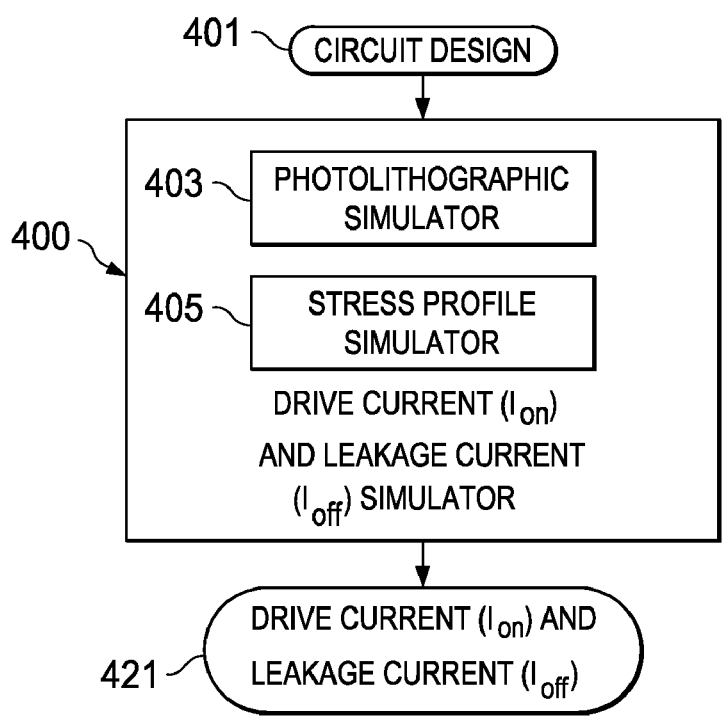
FIG. 4 is a block diagram of a drive current ($I_{on}$) and leakage current ($I_{off}$) simulator in accordance with an illustrative embodiment of the invention.

FIG. 4 is a block diagram of a drive current and leakage current simulator in accordance with an illustrative embodiment of the invention. Drive current ($I_{on}$) and leakage current ($I_{off}$) simulator 400 is a software component that operates on one or more data processing systems, for example, data processing system 100 of FIG. 1. Unless otherwise noted, a "simulator" herein is a drive current and leakage current simulator. It is appreciated that to achieve scaled increases in computing power and efficiency, multiple data processing systems may be networked together to run instances of simulators to collectively operate as a drive current and leakage current simulator. Circuit design 401 is a data file that defines circuit elements in the form of net lists and design rules, among other semiconductor parameters. Circuit design 401 can be a circuit layout. Simulator 400 can have task-specific software components used to process a circuit design. Photolithographic simulator 403 can process circuit design 401 by generating contours for circuit elements, including, for example, contours of a gate. Additional semiconductor features include the geometries of a gate that include gate width and gate lengths. Photolithographic simulators include, for example, PROLITH, and Calibre, among others.

Another useful descriptor of circuits of the circuit design is the stress profile for each gate. Stress profile simulator 405 can generate a profile along a plane for specified displacements along a width of a gate. Stress profiles are described above, with reference to stress profiles 371, 373, and 375 of FIG. 3. Accordingly, for example, three stress profiles can be generated for a gate having three corresponding slices as shown in FIG. 3. Stress profile simulators can be, for example, Tsuprem4, or others known in the art. Stress profiles are produced in accordance with instructions operating on a processor in the manner shown, e.g., in Synopsis TSU-PREM4 Manual, Version 2007.03, or Davinci 3D TCAD Manual, Version 2005.10, both incorporated by reference herein. Outputs from the simulator include drive current, $I_{on}$, and leakage current, $I_{off}$ 421.

Figure 5:
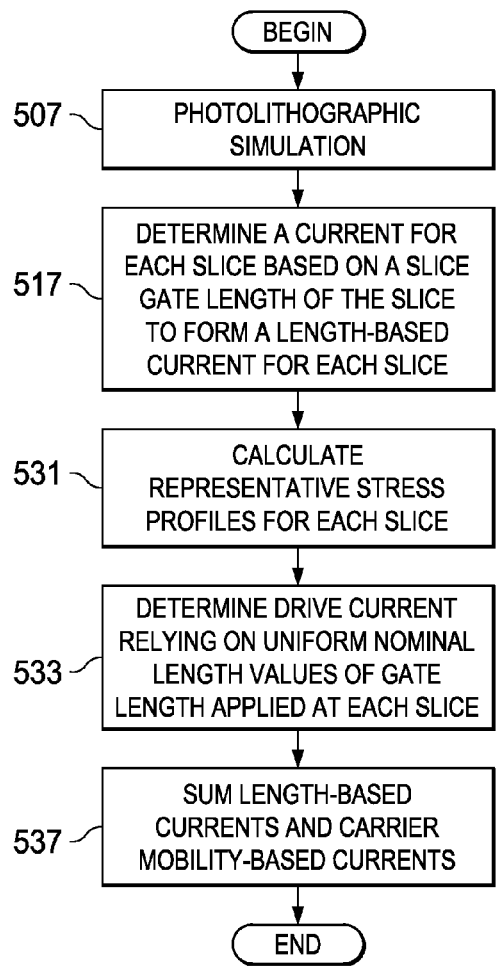
FIG. 5 is a flowchart of separate calculation of effective length and effective mobility in accordance with an illustrative embodiment of the invention.

FIG. 5 is a flowchart of separate calculation of effective length and effective mobility in accordance with an illustrative embodiment of the invention. Prior to the performance of FIG. 5, a circuit simulator may establish two look-up tables respectively of drive current, $I_{on}$, as a function of length and carrier mobility, μ, and of leakage current $I_{off}$. These look-up tables can be used later to derive an effective length and a carrier mobility for a rectangular gate that behaves in the same manner as the simulated non-rectangular gate. Initially a circuit design has input to a simulator for photolithographic simulation (step 507). In this step, the simulator obtains slices of each MOS gate described in the circuit design. Parameters describing each slice include a slice gate width and a slice gate length. Outputs of the photolithographic simulator include contour outlines of gates, as well as other semiconductor features.

Next, the simulator may determine a current for each slice based on a slice gate length of the slice to form a length-based current for each slice (step 517). Current in a slice or segment is a function of the length of the slice and the carrier mobility of the slice, among other things. Thus, a current in a 'x'th slice may be denoted as $I(L_x, \mu_x)$ where '$L_x$' is the length of the slice and '$\mu_x$' is the carrier mobility of the slice.

The current in all slices of the gate may be expressed as a vector in the form of $I(L_1, \mu=1), I(L_2, \mu=1), \ldots I(L_n, \mu=1)$. Wherein, for each slice among 'n' slices, a length, '$L_x$' is relied on, together with a uniform carrier mobility $\mu$ (set for example, to one) to establish a current. Uniform carrier mobility is held to a value, for example, 1 during step 517. This value, though expected to vary from the correct carrier mobility, will be used to do a look-up in the $I_{on}$ look-up table of $I_{on}$ to obtain an effective length for the gate under the condition of fixed carrier mobility. The value for carrier mobility set in step 517 can be a number by which the default value of low-field mobility is multiplied in a circuit simulator, such as, for example, power SPICE. As such, the setting of carrier mobility to 1 can be the equivalent of instructing the circuit simulator to use a default or nominal value for carrier mobility.

Next, the simulator may calculate a representative stress profile for each slice (step 531). The simulator may rely on stress profile simulator 405 (of FIG. 4) to perform this step. Next, the simulator may determine a drive current relying on uniform nominal length values of gate length applied at each slice to form a vector (step 533). The vector is a list of drive currents, one for each slice. This step may produce carrier mobility-based current for each slice. The carrier mobility-based current vector may be in the form of $I(L_{nominal}, \mu_1), I(L_{nominal}, \mu_2) \ldots, I(L_{nominal}, \mu_n)$, where, for each slice among 'n' slices, a slice carrier mobility is assigned. The carrier mobility for each slice can be $\mu_{eff}$, as calculated below:

$$\mu_{eff} = L(\mu_0) / \int (\mu_0 / \mu(x) dx) \tag{1}$$

Thus, for example, carrier mobility of 1.1, 1.0 and 0.9 may correspond with three slice carrier mobilities, $\mu_1, \mu_1,$ and $\mu_3$. The carrier mobilities can correspond, respectively, to stress profile 371, stress profile 373, and stress profile 375, of FIG. 3.

Next, the simulator may sum the length-based currents and carrier mobility-based currents (step 537). The simulator may sum the length-based current for MOS gate by summing the currents from the length-based vector, $I(L_1, \mu=1), I(L_2, \mu=1) \ldots I(L_n, \mu=1)$, to form a length-based current for the MOS gate. The simulator may also sum the carrier mobility-based currents for MOS gate by summing the currents from the carrier mobility-based current vector, $I(L_{nominal}, \mu_1), I(L_{nominal}, \mu_2) \ldots, I(L_{nominal}, \mu_n)$, to form a current, $I_\mu$ for the MOS gate. The simulator may then determine an effective length for the MOS gate based on the length-based current. In addition, the simulator may determine an effective mobility, $\mu_{eff}$, for the MOS gate. Processing may terminate thereafter.

Figure 6:
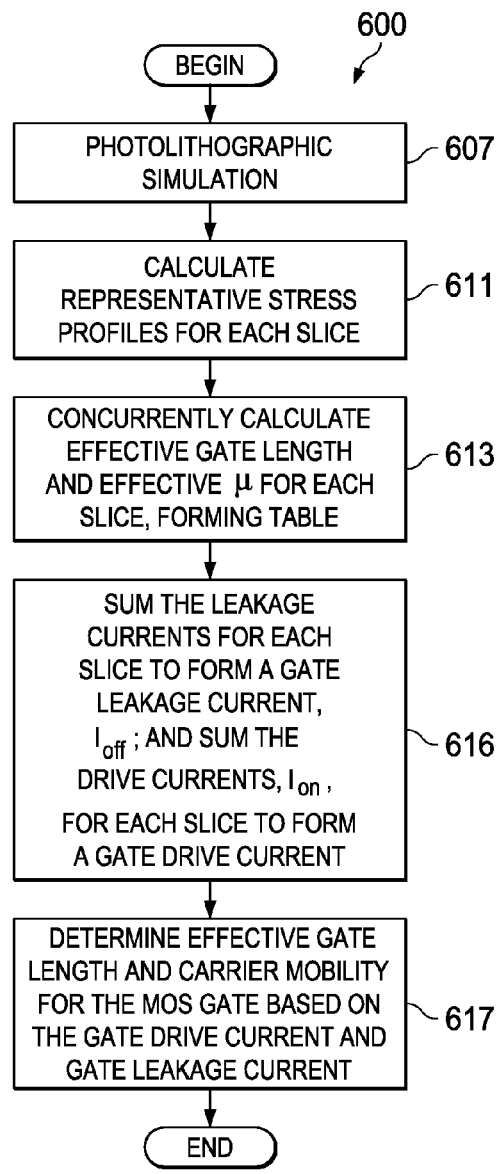
FIG. 6 is a flowchart of concurrent calculation of effective length and effective mobility in accordance with an illustrative embodiment of the invention.

FIG. 6 is a flowchart of concurrent calculation of effective length and effective mobility in accordance with an illustrative embodiment of the invention. Flowchart 600 shows an alternative way to determine drive current and leakage current for a gate. Initially, simulator performs photolithographic simulation (step 607). As part of step 607, the simulator may obtain slices of each MOS gate. Next, the simulator may calculate a representative stress profile for each slice (step 611). The simulator may rely on stress profile simulator 405 (of FIG. 4) to perform this step.

Next, the simulator may determine a drive current for each slice based on a slice gate length and a slice stress profile concurrently with determining a leakage current for each slice based on a slice gate length and a stress profile of the gate (step 613). This step may result in two vectors. A first vector may be a vector of drive currents comprised of a current for each slice: $I_{on}(L_1, \mu_1), I_{on}(L_2, \mu_2), \ldots I_{on}(L_n, \mu_n)$. A second vector may be a vector of leakage currents comprised of a current for each slice: $I_{off}(L_1, \mu_1), I_{off}(L_2, \mu_2), \ldots I_{off}(L_n, \mu_n)$. When performing a step concurrently, a microprocessor may be shared between multiple software components such that each software component's thread executes for a period, frees up resources, and remains quiescent for a time where the second software component's thread executes on the processor. Alternatively, multiple processors can perform plural threads such that machine instructions of each software component may execute nearly simultaneously.

Next, the simulator may sum the leakage currents for each slice to form a gate leakage current ($I_{off}$) (step 616). The simulator may also sum the drive currents ($I_{on}$) for each slice to form a gate drive current during this step. Based on the gate drive current and the gate leakage current, the simulator may concurrently determine an effective gate length and carrier mobility for the MOS gate (step 617). Step 617 can include using a look up table based approach to generate values of effective gate length, and effective carrier mobility to accurately match both drive current and leakage. The look-up table is composed of varied gate lengths and effective mobility values. Accordingly, a simulator can obtain drive current and leakage for different scenarios, which make up such a lookup table. Processing may terminate thereafter.

The illustrative embodiments permit a circuit designer or a circuit tester to obtain effective length for a non-rectangular metal oxide semiconductor (MOS) gate by approximating the non-rectangular gate with a rectangular MOS gate. Moreover, embodiments may concurrently apply varied stress profiles across a gate width to form an effective mobility of a non-rectangular and stress-varied MOS gate to model a physical gate or a proposed gate design in a manner that the model of the physical or proposed gate design has insubstantial differences in performance with the actual physical or proposed gate.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The invention can take the form of an entirely hardware embodiment, an entirely software embodiment or an embodiment containing both hardware and software elements. In a preferred embodiment, the invention is implemented in software, which includes but is not limited to firmware, resident software, microcode, etc.

Furthermore, the invention can take the form of a computer program product accessible from a computer-usable or computer-readable medium providing program code for use by or in connection with a computer or any instruction execution system. For the purposes of this description, a computer-usable or computer readable medium can be any tangible apparatus that can contain, store, communicate, propagate, or transport the program for use by or in connection with the instruction execution system, apparatus, or device.

The medium can be an electronic, magnetic, optical, electromagnetic, infrared, or semiconductor system (or apparatus or device) or a propagation medium. Examples of a computer-readable medium include a semiconductor or solid state memory, magnetic tape, a removable computer diskette, a random access memory (RAM), a read-only memory (ROM), a rigid magnetic disk and an optical disk. Current examples of optical disks include compact disk-read only memory (CD-ROM), compact disk-read/write (CD-R/W) and DVD.

A data processing system suitable for storing and/or executing program code will include at least one processor coupled directly or indirectly to memory elements through a system bus. The memory elements can include local memory employed during actual execution of the program code, bulk storage, and cache memories, which provide temporary storage of at least some program code in order to reduce the number of times code must be retrieved from bulk storage during execution.

Input/output or I/O devices (including but not limited to keyboards, displays, pointing devices, etc.) can be coupled to the system either directly or through intervening I/O controllers.

Network adapters may also be coupled to the system to enable the data processing system to become coupled to other data processing systems or remote printers or storage devices through intervening private or public networks. Modems, cable modem and Ethernet cards are just a few of the currently available types of network adapters.

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. A computer implemented method to determine metal oxide semiconductor (MOS) gate functional limitations, the computer implemented method comprising:
    obtaining a plurality of slices of a MOS gate, the slices each comprising at least one parameter, the parameter comprising a slice gate width and a slice gate length;
    determining a current for each slice based on a slice gate length of the slice to form a length-based current for each slice, wherein the current is in a channel adjacent the slice;
    determining a length-based current for the MOS gate by summing the length-based current for each slice;
    calculating a stress profile for each slice;
    determining a slice carrier mobility for each slice based on the stress profile of each slice;
    determining a carrier mobility-based current for each slice based on each slice carrier mobility;
    determining a carrier mobility for the MOS gate based on the carrier mobility-based current for each slice; and
    determining an effective length for the MOS gate based on the length-based current and the carrier mobility for the MOS gate.

2. The computer implemented method of claim 1, wherein determining an effective length for the MOS gate comprises looking up a gate length from a table for a fixed carrier mobility and current.

3. The computer implemented method of claim 1, wherein determining an effective length comprises summing currents for each length-based current to determine a gate effective length for the MOS gate, and wherein determining a carrier mobility for the MOS gate comprises summing carrier mobility-based currents for each mobility-based current.

4. The computer implemented method of claim 1, wherein the MOS gate is a non-rectangular gate.

5. The computer implemented method of claim 1, wherein calculating the stress profile is based on an addition of silicon-germanium to the MOS gate.

6. The computer implemented method of claim 1, wherein calculating the stress profile is based on the addition of an integrated circuit feature selected from a group consisting of a silicon nitride liner layer, silicon germanium source/drain region, and shallow trench isolation.

7. The computer implemented method of claim 1, wherein the plurality of slices comprises a first slice and a second slice, wherein the stress profile for the first slice is not uniform as compared to the stress profile of the second slice.

8. The computer implemented method of claim 1, wherein the slice gate length is an average of a contour of the gate within the slice.

9. A computer program product comprising a computer usable storage device including computer usable code for determining metal oxide semiconductor (MOS) gate functional limitations, comprising:
    computer usable program code configured to obtain a plurality of slices of a MOS gate, the slices each comprising at least one parameter, the parameter comprising a slice gate width and a slice gate length;
    computer usable program code configured to determine a current for each slice based on a slice gate length of the slice to form a length-based current for each slice, wherein the current is in a channel adjacent the slice;
    computer usable program code configured to determine a length-based current for the MOS gate by summing the length-based current for each slice;
    computer usable program code configured to calculate a stress profile for each slice;
    computer usable program code configured to determine a slice carrier mobility for each slice based on the stress profile of each slice;
    computer usable program code configured to determine a carrier mobility-based current for each slice based on each slice carrier mobility;
    computer usable program code configured to determine a carrier mobility for the MOS gate based on the carrier mobility-based current for each slice; and
    computer usable program code configured to determine an effective length for the MOS gate based on the length-based current and the carrier mobility for the MOS gate.

10. The computer program product of claim 9, wherein computer usable program code configured to determine an effective length for the MOS gate comprises computer usable program code configured to look up a gate length from a table for a fixed carrier mobility and current.

11. The computer program product of claim 9, wherein computer usable program code configured to determine an effective length comprises computer usable program code configured to sum currents for each length-based current to determine a gate effective length for the MOS gate, and wherein computer usable program code configured to determine a carrier mobility for the MOS gate comprises computer usable program code configured to sum carrier mobility-based currents for each mobility-based current.

12. The computer program product of claim 9, further comprising: computer usable program code configured to circuit simulate the MOS gate based on the effective length for the MOS gate and the carrier mobility for the MOS gate to determine whether the MOS gate functions within tolerances.

13. The computer program product of claim 9, wherein the MOS gate is a non-rectangular gate.

14. The computer program product of claim 9, wherein computer usable program code configured to calculate the stress profile is based on an addition of silicon-germanium to the MOS gate.

* * * * *